United States Patent [19]

Bosch et al.

[11] Patent Number: 4,473,433

[45] Date of Patent: Sep. 25, 1984

[54] PROCESS FOR PRODUCING DIELECTRICALLY ISOLATED SINGLE CRYSTAL SILICON DEVICES

[75] Inventors: Martin A. Bosch, Lincroft; Ross A. Lemons, Tinton Falls, both of N.J.

[73] Assignee: AT&T Bell Laboratories, Murray Hill, N.J.

[21] Appl. No.: 389,871

[22] Filed: Jun. 18, 1982

[51] Int. Cl.³ .............................................. C30B 1/08
[52] U.S. Cl. ........................... 156/620; 156/DIG. 64; 156/DIG. 80; 156/DIG. 88; 156/DIG. 105; 427/53.1; 148/1.5
[58] Field of Search ................... 156/601, 617 R, 620, 156/624, DIG. 64, DIG. 80, DIG. 88, DIG. 105, DIG. 111; 427/53.1, 86, 93, 95; 148/1.5, 175

[56] References Cited

U.S. PATENT DOCUMENTS

| | | | |
|---|---|---|---|
| 3,154,623 | 10/1974 | Reich | 156/601 |
| 4,059,461 | 11/1977 | Fan et al. | 156/DIG. 80 |
| 4,309,225 | 1/1982 | Fan et al. | 148/1.5 |
| 4,323,417 | 4/1982 | Lam | 156/613 |
| 4,371,421 | 2/1983 | Fan et al. | 156/DIG. 88 |

OTHER PUBLICATIONS

H. W. Lam et al., Single Crystal Silicon-on-Oxide by a Scanning CW Laser Induced Lateral Seeding Process, Sep. 1981, J. Electrochem, Soc: Solid-State Science And Technology, vol. 128, No. 9.

G. K. Celler et al., Seeded Oscillatory Growth of Si over SiO$_2$ By cw Laser Irradiation, Abstract No. 151, Conference Electrochemical Society Incorporated, Spring Meeting May 7–14, 1982 pp. 245, 246.

Primary Examiner—David L. Lacey
Attorney, Agent, or Firm—Bruce S. Schneider

[57] ABSTRACT

Well-oriented device quality silicon is formed on a dielectric material through a specific melting procedure. In this procedure, a body including polycrystalline or amorphous silicon overlying a dielectric is heated to a temperature close to the melting point of silicon. A narrow region of the amorphous or polycrystalline silicon whose length is substantially longer than its width is then melted using an energy source such as a laser. This long, narrow region is propagated through the amorphous or polycrystalline silicon to produce the desired device quality material.

8 Claims, 2 Drawing Figures

PROCESS FOR PRODUCING DIELECTRICALLY ISOLATED SINGLE CRYSTAL SILICON DEVICES

BACKGROUND OF THE INVENTION

1. Field of the Invention

This invention relates to semiconductor devices and, in particular, dielectrically isolated semiconductor devices.

2. Art Background

Electronic devices employing dielectric isolation offer advantages both for high-voltage applications and for applications requiring high reliability signal processing. These advantages are derived from the structure of such devices. In particular, a single crystal silicon active region or regions are separated from a common substrate by a region of dielectrically insulating material, e.g., silicon oxide. (The active region is the region where electronic devices such as transistors, diodes, and capacitors are to be or have been formed.) The dielectrically isolating material(s) provides a sufficient barrier to processes such as avalanche breakdown so that high voltages in one active region, e.g., voltages above 30 V, do not cause interaction with a second active region on the same substrate. Additionally, the dielectric insulator prevents carriers formed by interaction of cosmic radiation with the substrate from diffusing into an isolated active region and causing inaccuracies in information processed by the devices in that active region.

The use of a device quality silicon region on a bulk dielectric material is also advantageous in other applications such as for flat panel displays. In such applications device quality silicon overlying a dielectric material such as fused quartz is employed. The fused quartz is clear and is chosen to allow viewing of the display medium which generally overlies the silicon layer. The thin silicon layer is patterned to further enchance the viewability of the display medium and has a device or devices formed in it which control the operation of this medium.

Many procedures have been developed for producing a dielectrically isolated region of device quality silicon, i.e., silicon having a mobility of at least 100 $cm^2/V \cdot second$. One general type of procedure for fabricating dielectrically isolated structures involves traversing a molten zone across a polycrystalline silicon layer that has been deposited on a dielectric material such as silicon oxide. Generally, the molten zone is initially formed at a region of single crystal silicon adjoining the polycrystalline silicon. The molten zone is then traversed through the polycrystalline silicon to convert the region which overlies the dielectric material into device quality silicon. In one particular technique involving molten zone tranversal, a body having a dielectric material that is overlaid by a poly crystalline silicon layer is generally heated to a temperature of approximately 1100 degrees C. A strip of graphite having a width of approximately 1 mm and a length commensurate with the size of the substrate is resistively heated, positioned above the polycrystalline layer to form a melt zone, and translated to propagate this melt zone across the polycrystalline silicon. Without the supplemental heating, i.e., heating of the polycrystalline silicon region to 1100 degrees C., the graphite strip heater will not cause melting under practical conditions. Generally, by this graphite strip heater method which involves high temperature supplemental heating, silicon region having an average size of approximately 2 cm by 2 cm and typical mobilities of approximately 520 $cm^2/V \cdot second$ are produced. (See E. W. Maby et al, *Electon Device Letters*, EDL-2, 241 (1981) for a general description of this procedure and a discussion of the properties achieved.) Despite the acceptable quality of the resulting silicon, the process requires additional capping layers overlying the silicon layer and extremely strict control of processing parameters such as substrate temperature to prevent beading of the silicon layer with its resulting destruction. (See M. W. Geis et al, *Applied Physics Letters*, 40, 158 (1982).) Even with strict control, relatively uniform results are not achieved from sample run to sample run.

Lasers have also been employed to traverse a molten zone across a polycrystalline or amorphous silicon region, i.e., a non-single crystal silicon region. Available lasers have sufficient power to produce the melt zone without supplemental heating. Thus, supplemental heating is not essential. However, nominal supplemental heating—temperatures typically at or below 350 degrees C.—in laser techniques has been employed to reduce the power requirements on the laser and to achieve what is considered advantageous size melts, e.g., essentially round melts approximately 30 $\mu m$ in diameter. Since low supplemental temperatures have been considered an attribute to laser processing, use of temperatures above about 350 degrees C. have been generally avoided. (See J. F. Gibbons, *International Conference Solid State Devices, Tokyo*, 1979.) Although the mobilities of the resulting silicon are typically on the order of 100 $cm^2/V$. seconds, the mobility often varies substantially across the layer being processed.

Even though many techniques have been developed for producing dielectrically isolated silicon and even though many of these techniques have been found to be useful, it is always desiralbe to improve the mobility of the dielectrically isolated silicon region obtained and most significantly to dimish the difficulty involved in consistently obtaining regions with excellent and relatively uniform mobilities, i.e., mobilities varying no more than 25 percent over an area equal to at least 90 percent of the treated area.

SUMMARY OF THE INVENTION

Through the use of a relatively uncomplicated zone traversal fabrication procedure, dielectrically isolated device quality silicon is consistently (essentially 100 percent) obtained with essential uniform mobilities across the processed region except in a small area at the region extremities. To achieve this result, two criteria should be satisfied. Firstly, the polycrystalline silicon or amorphous silicon region overlying a dielectric material, e.g., a silicon oxide or fused quartz maaterial, should be heated to a temperature significantly higher than previously employed in laser melting techinques. Specifically, this temperature is maintained in a range 1000 to 1400 degrees C., i.e., at a temperature within 410 to 10 degrees C. of the melting point of the silicon. Secondly, a very thin molten zone -- no wider than 250 $\mu m$ with a length at least 5 times it width is established, for example, with a suitably shaped laserbeam, and propagated through at least a portion of the silicon region. Thus, through the use of an atypically high supplemental heating together with atypically narrow molten zone, device quality regions of uniformly high mobility, e.g. , as high as 400 $cm^2/V \cdot second$ are easily achieved.

DETAILED DESCRIPTION

Figure 1:
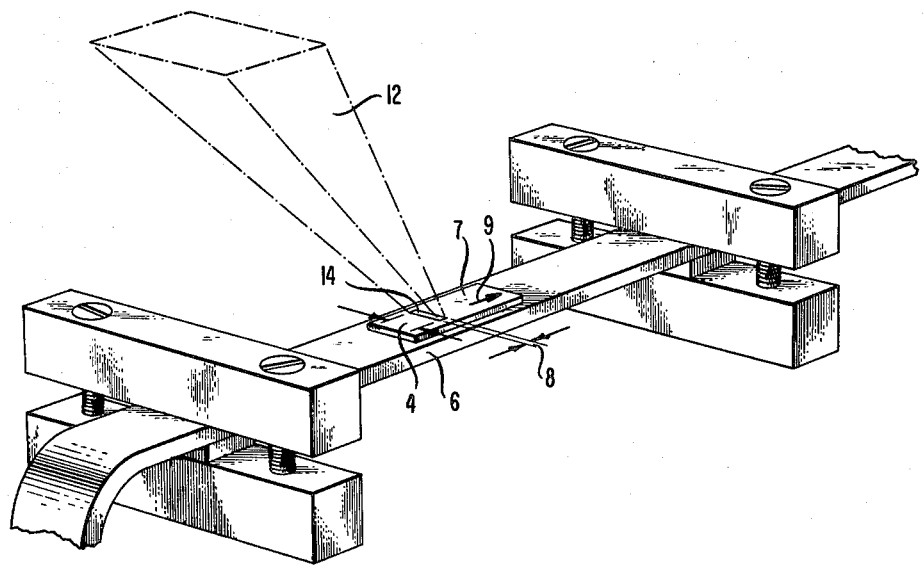
FIGS. 1 and 2 are illustrative of the inventive process.

The inventive procedure is practiced on either an amorphous or polycrystalline silicon region that overlies a dielectric region. The dielectric material and the overlying silicon are generally supported for mechanical stability by a relatively thick substrate. Generally the dielectric material having a thickness in the range 0.2 to 2 μm is employed to yield the desired isolation while, for typical device applications, overlying silicon regions with thicknesses in the range 0.2 to 2 μm generally are utilized. However, greater thicknesses are not precluded by the inventive process. (Use of a thick dielectric material, e.g., a fused quartz substrate, which does not require suport is also possible.)

A variety of techniques have been described for forming a suitable dielectric and silicon region supported by a suitable substrate. (See, for example, U. L Vossen and V. Kern, *Thin Film Processes*, Academic Press, New York, 1978.) In one exemplary procedure for forming a suitable substrate with an appropriate overlying layer, a single crystal silicon substrate is employed. The dielectric material is formed on the substrate by conventional techniques such as thermal oxidation as described in A. S. Grove, *Physics and Technology of Semiconductor Devices*, Wiley, 1967, or by deposition such as sputter deposition of a dielectric, e.g., silicon oxide, as described in Vossen, supra. Conventional photolithographic procedures are utilized during the dielectric material formation so that small areas, e.g., areas generally of dimension 10 μm by 1 cm of the underlying single crystal silicon substrate are left uncovered. A layer of silicon is deposited over the entire substrate surface. This growth is conveniently accomplished by a conventional chemical vapor deposition (CVD) procedure involving passing silane at a typical pressure of 0.2 Torr over the substrate which is heated to a temperature in the range of 500 to 800 degrees C. The resulting structure has a deposited low mobility silicon layer overlying a dielectric material which in turn overlies the silicon substrate.

By this procedure or by other procedures such as described in co-pending, coassigned U.S. patent application Ser. No. 231,238, filed Feb. 4, 1981 which is hereby incorporated by reference, an apropriate silicon layer overlying a dielectric material is formed. The particular method employed to produce the polycrystalline or amorphous silicon region overlying a dielectric material is not critical. The inventive technique works equally well irrespective of the method employed to produce the body that is to be treated by the inventive process. Additionally for applications such as flat panel displays, the silicon layer is depositable on a dielectric such as a fused quartz substrate without the presence of a contacting single crystal silicon region. It is advantageous but not essential to deposit a capping layer such as a silicon oxide layer with a thickness generally in the range 0.1 to 2 μm on the non-single crystalline silicon layer to aid in maintaining a smooth surface. This layer is deposited by conventional techniques, such as CVD, employing a silane and oxygen mixture.

The amorphous or polycrystalline silicon region is heated to a temperature in the range 1000 to 1400 degrees C. (This is generally accomplished by heating the entire substrate along with the dielectric and silicon regions.) Temperatures above 1400 degrees C. increase unacceptably the risk of melting the substrate or the overlying silicon layer through temperature non-uniformities while temperatures less than 1000 degrees C. produce a silicon layer with large-angle grain boundaries of random orientation resulting in degraded mobility and non-uniformity. The heating is accomplished by conventional techniques such as resistive heating. In particular, in one embodiment the substrate is placed on a heated plate, 6, in FIG. 1, and the plate together with the substrate, 7, is heated to a temperature in the range 1000 to 1400 degrees C. However, techniques employed where the substrate is not at the same temperature as the polycrystalline or amorphous silicon region are not precluded provided this silicon region is held at a temperature in the desired range.

Figure 2:
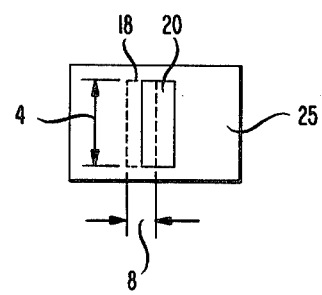

A molten zone is then established which has a width, 8, as shown in FIGS. 1 and 2 which is no greater than 250 μm, preferably not greater than 100 μm. (This width is measured at the midpoint of the zone length and in the direction, 9, in which the beam is to be propagated.) Additionally, the length, 4, of this molten region should be at least 5 times the width of the region, preferably 50, most preferably 100 times the width. If the fraction of width to length is above 0.2 an unacceptably large variability in mobilities in the resulting treated layer is obtained. The power required to melt the silicon over a region of appropriate dimensions to an extent, in fact, depends on these dimensions and on the supplemental heating temperature. A control sample is utilized to determine the best power level for a given polycrystalline or amorphous silicon layer thickness. However, generally for typical polycrystalline or amorphous silicon layer thicknesses in the range 0.5 to 2.0 μm, power densities in the range $5 \times 10^3$ to $5 \times 10^4$ Watts/cm$^2$ are employed.

The use of a laser to estabish the molten zone is particularly convenient. Laser such as an argon ion laser easily produce the desired power densities to initiate melting over an appropriately dimensioned area, 14. Melting is essentially coextensive with the shape of the laser beam. The laser beam, 12, is easily configured to the desired shape through the use of lenses and/or mirrors. Light in the wavelength range 1.1 μm to 0.4 μm such as light from an appropriate laser is absorbed in the silicon and heating is thus produced directly by absorption of radiant energy. However, the possibility of the use of light absorbed in the underlying dielectric material and followed by production of a melt zone through conduction from this dielectric is not precluded. Additionally, the use of a power source other than a laser which yields the desired zone shape and power density is also not precluded.

A molten zone is advantageously established so that at least a portion of the single crystal region, 20, adjoining a polycrystalline or amorphous silicon region, 25, is melted, That is, in the plan view of the body to be heated, FIG. 2, if 20 is a single crystal region an appropriate first zone is delimited by dotted boundaries, 18. If a contacting single crystal silicon region is not present, then a melt zone contacting such region is not employed, but useful material is still obtained. Generally when such contact is not employed the crystal orientation normal to the substrate is still uniform. In this case, however, unlike the situation when a contacting single crystal region is employed, the azimuthal orientation of the device quality silicon that is formed is the same over large regions. However, regions of different crystallographic orientation are present. Since the regions are quite large, significant difficulties are not introduced and the processed material is quite acceptable for many applications. Additionally, if these regions are acceptable for a given application, even if a single crystal nucleation region is present, it need not be employed as a melt zone before propagation through the polycrystalline or amorphous silicon. The molten zone once established is propagated through at least a portion and preferably through all of the amorphous or polycrystalline silicon region. This progapation is typically done at a rate in the range 0.1 mm per second to 10 mm per second. Typically, faster propagation rates cause a loss of crystal orientation. Slower propagation rates are inconvenient and generally uneconomical. The propagation of the molten zone results in regions of device quality silicon having a high mobility, e.g., as high as 400 $cm^2/V$·second. Additionally, quite acceptable mobilities are achieved from sample to sample and uniform mobilities across the heated portion of a given sample are obtained. It is, in fact, possible to enhance even further the uniformity by using multiple passes of a molten zone across the treated portion of the non-single crystal silicon region.

the following examples are illustrative of the conditions employed in the inventive technique.

EXAMPLE 1

A single crystal silicon wafer having its major surface oriented in the (100) plane with a 5 cm diameter, and a 0.5 mm thickness was employed. The wafer was boron doped to a resistivity of between 0.004 and 0.005 Ohm-cm. The wafer was degreased by sequentially immersing the wafer in trichloroethylene at 80 degrees C. for 15 minutes, in acetone at room temperature for 2 minutes and in methanol at room temperature for 2 minutes. The wafer was then removed from the methanol treatment and rinsed in deionized water. The wet wafer was then scrubbed in a deionized water detergent mixture. A mixture of 100 parts by volume deionized water, 31 parts by volume sulfuric acid and 25 parts by volume of a 30 percent aqueous hydrogen peroxide solution was prepared. The wafer was inserted in this boiling solution for 15 minutes. The wafer was then rinsed in deionized water, immersed for 2 minutes in a 100 to 1 by volume mixture of deionized water and HF, and again rinsed in deionized water. The wafer was then spun dried.

The wafer was inserted in a wet thermal oxidation apparatus. The gas flow in the apparatus was established by passing dry oxygen through a water bubbler at a rate of approximately 50 cc/minute. The wafer was heated to approximately 1050 degrees C. and was kept at this temperature for a time sufficient to grow a 1 $\mu$m thick layer of silicon dioxide. The wafer was then removed from the sample holder of the thermal oxidizer and placed in a sample holder of a reduced pressure CVD reactor manufactured by AMT Company. The deposition chamber was evacuated to a pressure of approximately 0.02 Torr, and the deposition chamber was heated to a temperature of approximately 620 degrees C. The substrate was allowed to equilibrate to this temperature. A silane flow of 45 cc/minute at a pressure of 0.185 Torr was established in the reaction chamber. The gas flow was continued for 70 minutes yielding a layer of polycrystalline silicon approximately 0.75 $\mu$m thick.

After this 70 minute treatment, the gas flow was terminated and the chamber evacuated to a pressure of 0.02 Torr. The chamber was then backfilled with 1 atm of dry nitrogen. A cap layer was deposited also in a separate deposition chamber of the same reduced pressure CVD reactor. To accomplish this deposition the deposition chamber was evacuated to a pressure of 0.02 Torr. The chamber was heated to 420 degrees C., and the substrate was allowed to equilibrate to this temperature. A gas flow of 160 cc/minute of oxygen and 0.5 l/minute of nitrogen was established for 5 minutes. After this time period approximately 20 cc/minutes of silane was added to the gas flow to yield a total gas pressure of approximately 0.45 Torr. The combined gas flow was continued for four hours to yield a 2.0 $\mu$m thick silicon dioxide cap layer. The gas flow was then discontinued and the chamber exacuated to a pressure of approximately 0.2 Torr. The chamber was backfilled with nitrogen and the wafer was removed.

The wafer was then placed on a graphite plate measuring approximately 5 cm by 15 cm by 1.3 mm. The graphite plate was housed in an airtight vessel which was purged with dry nitrogen for approximately 5 minutes. Approximately 500 amps were passed through the plate to heat it and the wafer to a temperature of approximately 1350 degrees C. as measured with an optical pyrometer. A 1 cm diameter beam from an argon ion laser having a power of 19 Watts and a wavelength of 0.5145 $\mu$m was passed through a cylindrical lens (f=15 cm) and was made incident on the substrate to produce a 1 cm by 50 $\mu$m melt zone. The melt zone was passed across the wafer by translating the graphite plate and thus the wafer at a rate of approximately 1 mm per second. When the zone traversal was completed, the current through the plate was reduced to zero and the wafer was cooled for approximately 1 minute. The resulting silicon film has a mirror-like surface with a [100] crystal orientation normal to the major surface of the wafer and low-angle grain boundaries approximately 100 $\mu$m long and 5 to 10 $\mu$m apart. The mobility of the resulting silicon film was at least 150 $cm^2/V$·seconds across 90 percent of the treated area with a variation no greater than 20 percent.

EXAMPLE 2

A 2.5 cm by 2.5 cm by 1 mm General Electric Company type 124 fused quartz substrate was employed. The substrate was immersed in an ultrasonic bath of a soapy solution for 15 minutes at 80 degrees C. The substrate was then sequentially rinsed for 3 minutes in flowing deionized water and for a brief period in acetone. After the acetone rinse, the substrate was immersed in an ultrasonic bath of trichloroethane at 60 degrees C. for 15 minutes. The wafer was then sequentialy rinsed in an acetone bath for 10 minutes, in a methanol bath for 5 minutes, and in flowing deionized water for 3 minutes. A 1:1:1 by volume solution of deionized water, sulfuric acid and 30 percent aqueous hydrogen peroxide was prepared. The substrate was immersed in this bath for approximately 15 minutes and then rinsed for 3 minutes in deionized water. A 1 to 100 by volume mixture of HF and deionized water was prepared. The substrate was immersed in this mixture for 15 minutes and rinsed in deionized water 5 minutes. The cleaned substrate was then stored in deionized water until it was ready for placement in the growth apparatus. Before growth, the substrate was spun dry.

The wafer was placed in the sample holder of an Applied Materials Company CVD reactor. The substrate was heated in dry, flowing nitrogen at 700 degrees C. for 15 minutes. The substrates were cooled to the deposition temperature of 650 degrees C. A flow of 600 cc/minute of 3 percent silane in argon was then introduced in addition to the nitrogen carrier gas. The total flow of the nitrogen carrier gas and the silane mixture was 55 1/minute. The deposition continued at a rate of 100 Å per minute until it was terminated when a silicon layer of 1 μm thickness was obtained. The chamber was then subjected to a flow of only dry nitrogen (50 1/minute) while the substrate was heated to a temperature of 860 degrees C. and maintained at that temperature for 15 minutes. The substrate temperature was reduced to 810 degrees C. The nitrogen flow was combined with a flow of 600 cc/minute of a 3 percent silane in argon mixture and with a 550 cc/minute flow of nitrous oxide. Silicon dioxide was deposited on the substrate at a rate of 400 Å per minute. The deposition was continued until a silicon dioxide layer having a thickness of approximately 2 μm was obtained. The wafer with its overlying layers was then treated by the melt zone translation procedure described in Example 1 except the graphite heater was maintained at a temperature of 1250 degrees C. The silicon layer obtained was smooth and reflective and the (100) planes of the treated silicon lie generally parallel to the major surface of the substrate.

What is claimed is:

1. A process for producing device quality silicon overlying a dielectric material by treating at least a portion of a non-single crystalline silicon region which overlies said dielectric material, said process comprising the steps of heating said portion of said non-single crystalline silicon region to a temperature in the range of 1000 to 1400 degrees C., establishing a molten zone in said non-single crystalline silicon region which is narrower than 250 μm with a length of said zone which is at least 5 times its width, and traversing said zone across said portion of said non-single crystalline silicon region.

2. The process of claim 1 wherein said zone is narrower than 100 μm.

3. The process of claim 1 wherein said non-single crystalline silicon is polycrystalline silicon.

4. The process of claim 1 wherein said dielectric material is fused quartz.

5. The process of claim 1 wherein said dielectric material is a silicon oxide.

6. The process of either claim 1 or 5 wherein said molten zone is established in a single crystal silicon region adjoining said non-single crystal silicon region and then propagated through at least a portion of said non-single crystalline silicon region.

7. The process of claim 6 wherein said molten zone is formed by using light from a laser.

8. The process of claim 1 wherein said molten zone is formed by using light from a laser.

* * * * *

UNITED STATES PATENT AND TRADEMARK OFFICE
CERTIFICATE OF CORRECTION

PATENT NO. : 4,473,433

DATED : September 25, 1984

INVENTOR(S) : Martin A. Bosch and Ross A. Lemons

It is certified that error appears in the above-identified patent and that said Letters Patent is hereby corrected as shown below:

Column 1, line 68, "region" should read --regions--. Column 2, line 37, "desiralbe" should read --desirable--; line 61, "width" should read --width -- --; line 65, "atypically" should read --an atypically--. Column 5, line 26, "the" should read --The--. Column 6, line 17, "exacuated" should read --evacuated--.

Signed and Sealed this

Fourth Day of June 1985

[SEAL]

Attest:

DONALD J. QUIGG

Attesting Officer

Acting Commissioner of Patents and Trademarks